(12) United States Patent
Ruesch

(10) Patent No.: US 7,327,167 B2
(45) Date of Patent: Feb. 5, 2008

(54) ANTICIPATORY PROGRAMMABLE INTERFACE PRE-DRIVER

(75) Inventor: Rodney Ruesch, Eau Claire, WI (US)

(73) Assignee: Silicon Graphics, Inc., Sunnyvale, CA (US)

( * ) Notice: Subject to any disclaimer, the term of this patent is extended or adjusted under 35 U.S.C. 154(b) by 129 days.

(21) Appl. No.: 11/116,734

(22) Filed: Apr. 28, 2005

(65) Prior Publication Data

US 2006/0244486 A1    Nov. 2, 2006

(51) Int. Cl.
    *H03K 19/0185*    (2006.01)
(52) U.S. Cl. .................. 326/86; 326/56; 327/108; 327/374
(58) Field of Classification Search .......... 326/30, 326/57, 58, 86; 327/108
    See application file for complete search history.

(56) References Cited

U.S. PATENT DOCUMENTS

| | | | |
|---|---|---|---|
| 4,375,051 A | 2/1983 | Theall | |
| 4,477,713 A | 10/1984 | Cook et al. | |
| 4,514,749 A | 4/1985 | Shoji | |
| 4,587,445 A | 5/1986 | Kanuma | |
| 4,823,184 A | 4/1989 | Belmares-Sarabia et al. | |
| 4,896,272 A | 1/1990 | Kurosawa | |
| 4,926,066 A | 5/1990 | Maini et al. | |
| 5,023,488 A | 6/1991 | Gunning | |
| 5,194,765 A | 3/1993 | Dunlop et al. | |
| 5,295,132 A | 3/1994 | Hashimoto et al. | |
| 5,315,175 A | 5/1994 | Langner | |
| 5,337,254 A | 8/1994 | Knee et al. | |
| 5,394,528 A | 2/1995 | Kobayashi et al. | |
| 5,416,606 A | 5/1995 | Katayama et al. | |
| 5,481,567 A | 1/1996 | Betts et al. | |
| 5,483,188 A | 1/1996 | Frodsham | |
| 5,490,252 A | 2/1996 | Macera et al. | |
| 5,521,836 A | 5/1996 | Hartong et al. | |
| 5,535,223 A | 7/1996 | Horstmann et al. | |
| 5,544,203 A | 8/1996 | Casasanta et al. | |
| 5,555,188 A | 9/1996 | Chakradhar | |
| 5,598,119 A | 1/1997 | Thayer et al. | |
| 5,604,450 A | 2/1997 | Borkar et al. | |
| 5,631,611 A | 5/1997 | Luu | |
| 5,657,346 A | 8/1997 | Lordi et al. | |
| 5,661,415 A | 8/1997 | Aoki et al. | |
| 5,701,331 A | 12/1997 | Hunt | |
| 5,757,658 A | 5/1998 | Rodman et al. | |
| 5,778,308 A | 7/1998 | Sroka et al. | |
| 5,781,050 A | 7/1998 | Russell | |
| 5,787,268 A | 7/1998 | Sugiyama et al. | |
| 5,793,259 A | 8/1998 | Chengson | |

(Continued)

OTHER PUBLICATIONS

*Lattice Semiconductor Corporation*, http://www.latticesemi.com, (2002), 7 pgs, no month.

(Continued)

*Primary Examiner*—Vibol Tan
(74) *Attorney, Agent, or Firm*—Schwegman, Lundberg & Woessner, P.A.

(57) ABSTRACT

This document discusses, among other things, a circuit for selectively engaging an output section based on a received data signal. The output is driven to a high-impedance state in anticipation of a possible change in driving agent. An output section includes active transistor elements and a pre-driver.

12 Claims, 5 Drawing Sheets

U.S. PATENT DOCUMENTS

| | | |
|---|---|---|
| 5,811,997 A | 9/1998 | Chengson et al. |
| 5,828,833 A | 10/1998 | Belville et al. |
| 5,844,954 A | 12/1998 | Casasanta et al. |
| 5,847,592 A | 12/1998 | Gleim et al. |
| 5,852,372 A | 12/1998 | Boeckmann et al. |
| 5,889,419 A | 3/1999 | Fischer et al. |
| 5,898,729 A | 4/1999 | Boezen et al. |
| 5,910,898 A | 6/1999 | Johannsen |
| 5,915,104 A | 6/1999 | Miller |
| 5,929,717 A | 7/1999 | Richardson et al. |
| 5,940,448 A | 8/1999 | Kuo |
| 5,966,032 A | 10/1999 | Elrabaa et al. |
| 5,973,515 A | 10/1999 | Marbot et al. |
| 6,005,895 A | 12/1999 | Perino et al. |
| 6,016,553 A | 1/2000 | Schneider et al. |
| 6,040,732 A | 3/2000 | Brokaw |
| 6,051,995 A | 4/2000 | Pollachek |
| 6,060,907 A | 5/2000 | Vishwanthaiah et al. |
| 6,078,978 A | 6/2000 | Suh |
| 6,118,310 A | 9/2000 | Esch, Jr. |
| 6,160,423 A | 12/2000 | Haq |
| 6,184,717 B1 | 2/2001 | Crick |
| 6,222,389 B1 | 4/2001 | Williams |
| 6,310,815 B1 | 10/2001 | Yamagata et al. |
| 6,326,821 B1 | 12/2001 | Gabara |
| 6,366,139 B1 | 4/2002 | Ang et al. |
| 6,509,757 B1 | 1/2003 | Humphrey |
| 2002/0118037 A1 | 8/2002 | Kim et al. |

OTHER PUBLICATIONS

"Low Power Quad Differential Line Driver with Cut-Off", *National Semiconductor*, F100K ECL 300 Series Databook and Design Guide, pp. 2-54-2-60, (1992), no month.

"The SA27 library includes programmable delay elements DELAYMUXO and DELAYMUXN. How are these cells used?", *IBM Delaymuxn Book*, (Feb. 1999), 1-6.

Djordjevic, A. R., et al., "Time Domain Response of Multiconductor Transmission Lines", *Proceedings of the IEEE*, 75(6), (Jun. 1987), 743-64.

Im, G., et al., "Bandwidth-Efficient Digital Transmission over Unshielded Twisted-Pair Wiring", *IEEE Journal on Selected Areas in Communications*, 13(9), (Dec. 1995), 1643-1655.

Mooney, Randy, et al., "A 900 Mb/s Bidirectional Signaling Scheme", *IEEE Journal of Solid-State Circuits*, 30(12), (Dec. 1995), 1538-1543.

Takahashi, T., et al., "110GB/s Simultaneous Bi-Directional Transceiver Logic Synchronized with a System Clock", *IEEE International Solid-State Circuits Conference*, (1999), 176-177, no month.

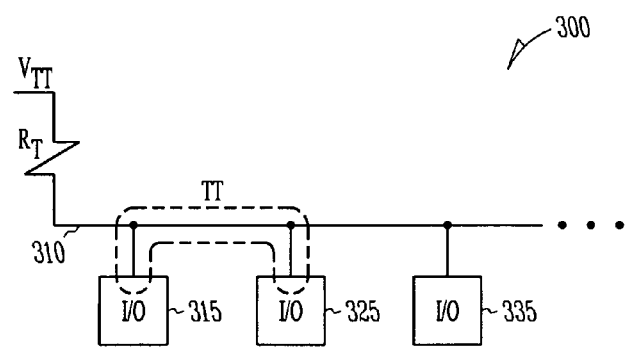
FIG. 3
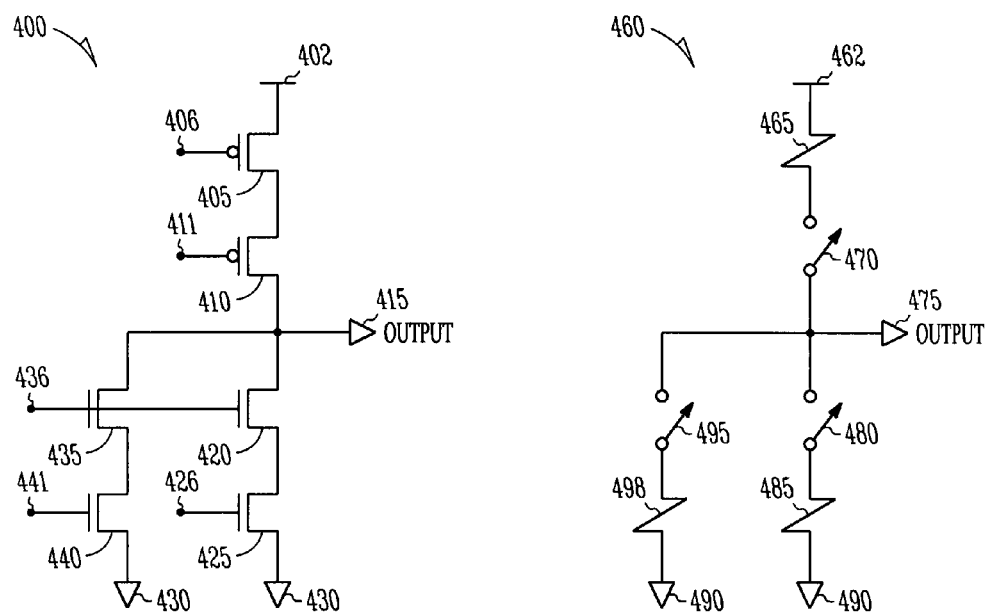
FIG. 4A  FIG. 4B

ANTICIPATORY PROGRAMMABLE INTERFACE PRE-DRIVER

CROSS-REFERENCE TO RELATED APPLICATIONS

This patent application is related to U.S. patent application Ser. No. 09/620,679, filed Jul. 20, 2000, entitled "GTL+ DRIVER" and U.S. Pat. No. 6,686,765, filed Jul. 31, 2002 as Ser. No. 10/210,700, entitled "GTL+DRIVER," each of which is incorporated by reference herein.

This patent application is related to U.S. Pat. No. 6,703,908, filed Jul. 20, 2000 as Ser. No. 09/619,724, entitled "I/O IMPEDANCE CONTROLLER," and is incorporated by reference herein.

TECHNICAL FIELD

This document pertains generally to buss interfaces, and more particularly, but not by way of limitation, to an anticipatory programmable interface pre-driver.

BACKGROUND

Of the many trends apparent in the electronic industry, two noteworthy examples include increased processor speeds and reduced power consumption. The trend toward increased processor speed enables execution of sophisticated and complex calculations at ever increasing speeds. Commensurate with an increased speed is the reduced time available in which digital data may be transmitted and received. The trend toward reduced power consumption facilitates devices operable with battery power or other means having a reduced power supply capacity. Also, low power devices dissipate less heat which further enables a higher component density and yet provide reliable operation.

The limited amount of available space on an integrated circuit often constrains the placement of components, including such circuits as drivers. A driver circuit is used to receive an input signal and provides an output signal on off-chip interconnect lines.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 3 illustrates a multiple device embodiment.

FIGS. 4A and 4B illustrate an output driver circuit.

DETAILED DESCRIPTION

The following detailed description includes references to the accompanying drawings, which form a part of the detailed description. The drawings show, by way of illustration, specific embodiments in which the invention may be practiced. These embodiments, which are also referred to herein as "examples," are described in enough detail to enable those skilled in the art to practice the invention. The embodiments may be combined, other embodiments may be utilized, or structural, logical and electrical changes may be made without departing from the scope of the present invention. The following detailed description is, therefore, not to be taken in a limiting sense, and the scope of the present invention is defined by the appended claims and their equivalents.

In this document, the terms "a" or "an" are used, as is common in patent documents, to include one or more than one. In this document, the term "or" is used to refer to a nonexclusive or, unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Figure 1:
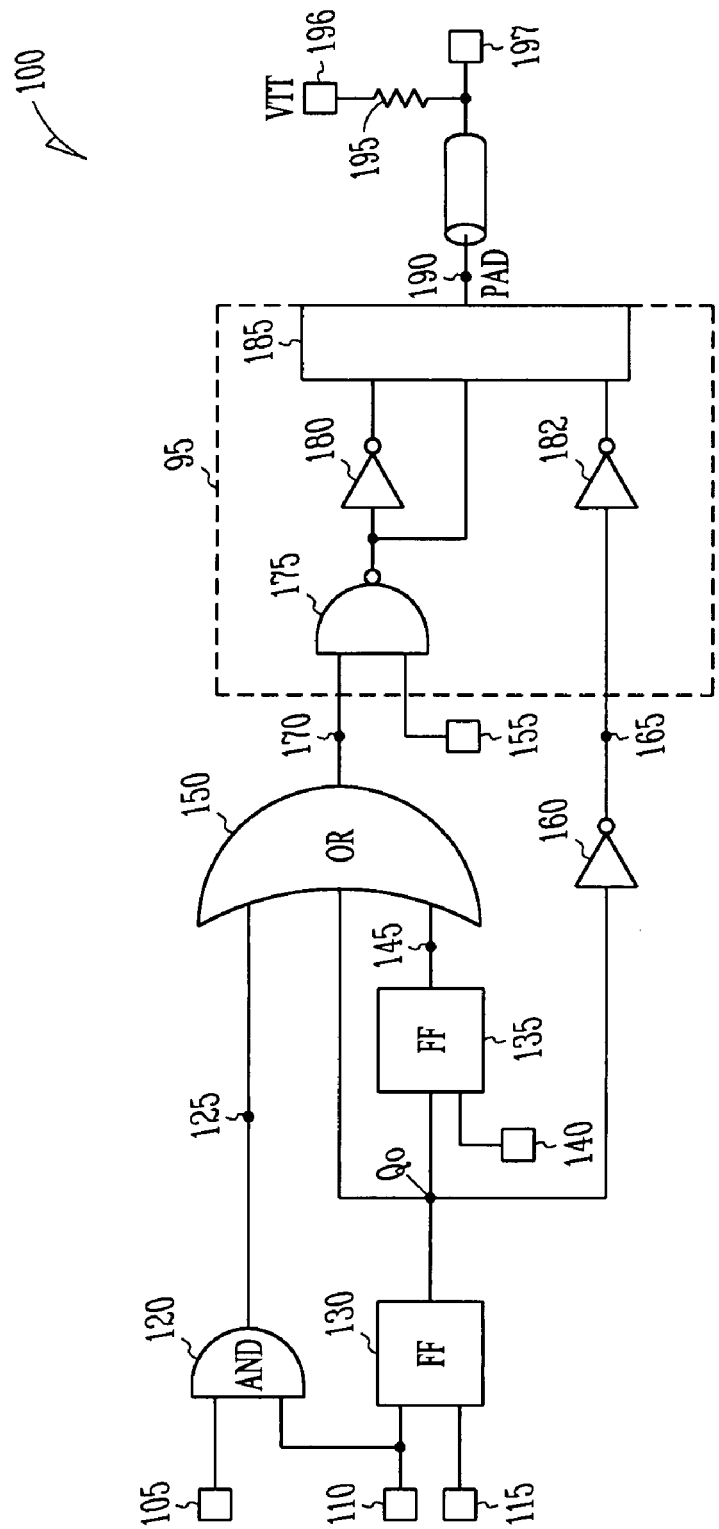
FIG. 1 illustrates a block diagram of an electrical circuit.

FIG. 1 illustrates circuit 100 including AND gate 120, OR gate 150, flip-flops 130 and 135, inverter 160 and I/O section 95. FIG. 1 also illustrates an off-pad terminator with termination resistance 195 and a termination voltage 196 also labeled $V_{TT}$.

The logic illustrated in circuit 100 of FIG. 1 controls operation of I/O section 95 to switch it on and off rapidly. In a typical I/O section, the output enable (OE) time to the pad signal is slow because of additional logic elements such as NAND gate 175 and inverter 180. The data signal is normally applied to node 165 and passes through inverter 182 before arriving at output section 185 and pad 190. In such a circuit, the signal path from node 165 to pad 190 is typically faster than the signal path from node 170 to pad 190.

Input 155 is sometimes referred to as a driver inhibit (DI) input. Input 155 can be used for boundary scan or as a test-availability signal and provides a control to turn the driver on or off thus bypassing the core logic. The propagation delay through NAND gate 175 introduces a delay or asymmetry between the two different input paths. The present subject matter provides a bypass of that delay at certain frequencies and with certain bus topologies.

The present subject matter synchronizes the OE (output enable) signals to the data signals. This circuit sends a data signal to the driver and determines when to turn on node 165 and when to turn on the node 170 and turn them off and on with appropriate sequencing.

Three input OR gate 150 is a power saving mechanism.

Figure 2:
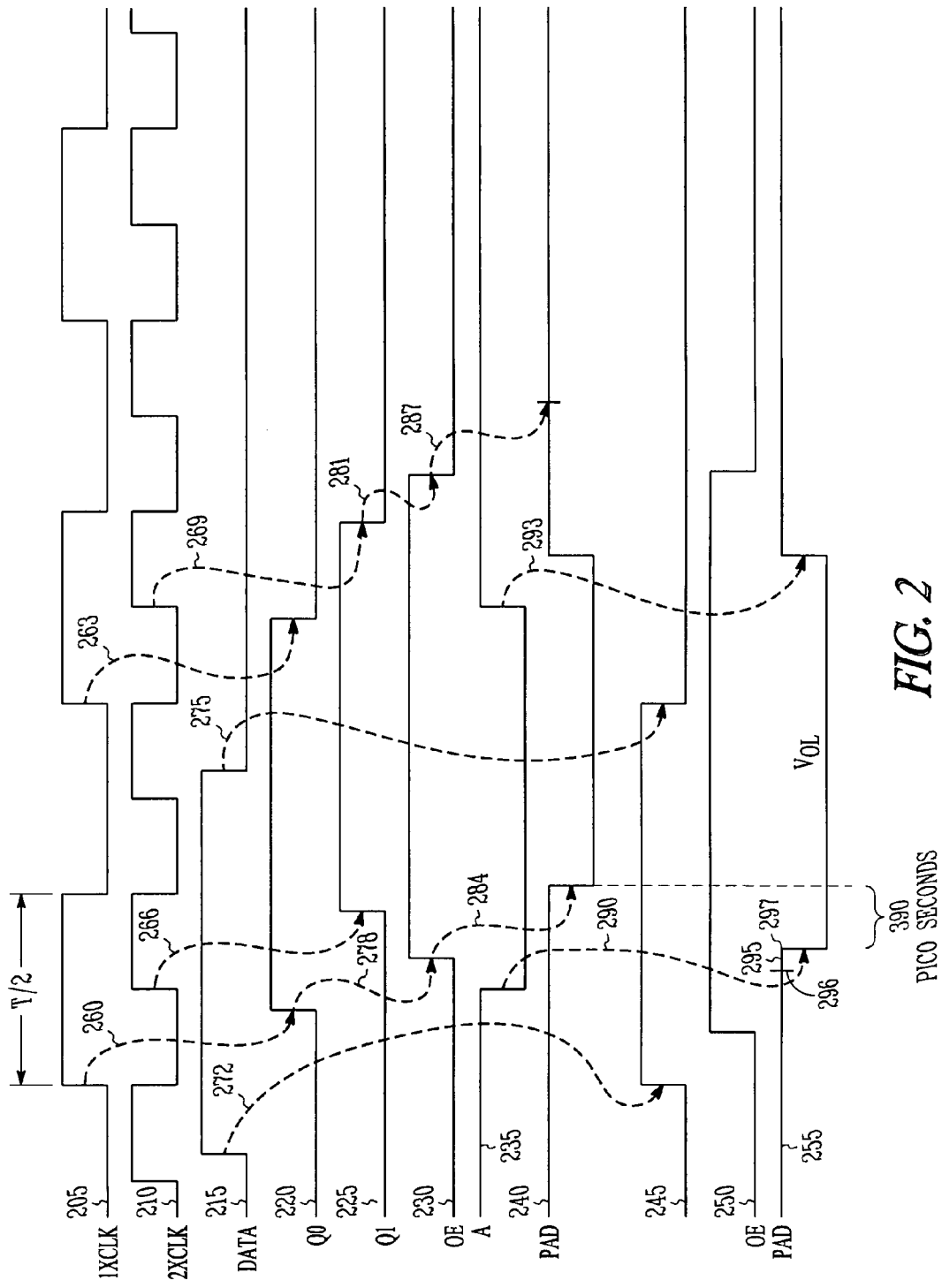
FIG. 2 illustrates a timing diagram corresponding to the circuit of FIG. 1.

FIG. 2 illustrates a time representation of selected signals corresponding to FIG. 1. Time is increasing with movement to the right of the figure. Signal 205 corresponds to a first clock running at a primary frequency and signal 210 corresponds to a second clock running at twice the primary frequency and inverted. Signal 215 represents incoming data which, in one example, is derived from a core logic circuit and is delivered to interface circuit 100 depicted in FIG. 1.

With reference to FIG. 2, signal 220 (also labeled Q0) is the output of flip flop 130. Clock signal 205 is applied to input 115 of circuit 100. On a rising edge of clock signal 205, node Q0 will exhibit a rising edge since the data signal at input 110 also rose before clock 205, as indicated by arrow 260.

A signal applied to input 105 is the control signal to effectuate the bypass. When input 105 is turned on, and when operating at a fast clock frequency, flip flop 130 (and the associated delay) is bypassed and data applied to input 110 passes through AND gate 120. Data applied to input 110 is provided to AND gate 120 and flip flop 130. When input 105 is high, then the data path will bypass flip flop 130. In one example, input 105 receives a signal that has a programmable level based on the clock frequency. When used in a low speed application, the present subject matter may cause contention on the bus, meaning that this driver attempts to take over the bus before it has been released by another driver also coupled to the bus.

Flip flop 130 and flip flop 135, in one example, are both known as D flip flops. Standard protocol for D flip flops provides that the data rises before the first clock and this time period is referred to as the setup time. On the rising edge of the clock, the data comes through flip flop 130 and is called the "output terminal" or node Q0. In FIG. 2, data appears at signal 215. Input 140 to flip flop 135 receives a double speed and inverted clock signal.

Clock signal 205 goes high after the data on signal 215 rises. Shortly after clock signal 205 rises, signal 220 (Q0) follows the data transition, as indicated by arrow 260. Signal 220 is the output of flip flop 130. Signal 220, along with clock 210, is provided to flip flop 135.

In addition, signal 220 is provided to inverter 160 which goes to node 165. When the signal at node 165 transitions, data is sent to the data path of I/O section 195 indicating that data is ready to be transmitted. Before data can be transmitted onto the bus, section 95 of FIG. 1 is turned on. Section 95 is turned on by the OE signal on node 170. Node 145 is the output of flip flop 135. As illustrated in FIG. 2, the data changes before the rising edge of the clock (signal 205). When signal 220 is going high, then shortly thereafter, clock 210 goes high which thereafter causes node 145 to also go high, as indicated by arrow 266.

Node 145 is one of three inputs to OR gate 150. If any of the OR gate 150 inputs goes high, then the signal at node 170 will go high. With reference to FIG. 2, when node Q0 went high, shortly thereafter, the signal at node 145 transitions high, as shown by arrow 266. This illustrates the time lag represented by the propagation delay through the gates.

Signal 235 is provided to I/O section 95 at node 165. As illustrated in FIG. 2, signal 235 drops before signal 230 rises. This time lag prevents achieving the full speed of the bus since signal 230 (OE) will transition and cause signal 240 (the PAD) to transition. When signal 230 transitions to high, signal 240 turns on and transitions low, as indicated by arrow 284. Signal 240 went low because signal 235, that is node 165 to I/O section 95 (the data signal to the I/O section) went low and then signal 230 (OE) went high, thus turning the driver on, thus driving signal 255 (PAD) low.

In other words, signal 230 (OE) rising is linked to signal 240 (the PAD) dropping sometime thereafter, as indicated by arrow 284.

Signal 235 indicates the direction of transition for signal 240. Signal 230 (OE) serves to turn the driver on. As used herein, the term high refers to a high voltage state and low refers to a low voltage state, however other signals or levels can also be used.

In FIG. 2, signals 245, 250 and 255 correspond to bypassing the OE such as when operating at a higher frequency. Bypass is enabled when node 105 is set to a logical value one and disabled (or terminate the bypass) when node 105 is set to a logical value of zero. In one example, the signal applied to node 105 is programmable.

When node 105 is programmed high, the data on node 110 appears at node 125 by virtue of logical AND gate 120. Node 125 also is one of the three inputs to OR gate 150, and as shown in FIG. 2, exhibits a propagation delay. In other words, signal 245 is a delayed copy of the data on signal 215.

A comparison of signal 250 (OE when by-passing flip flop 130) and signal 230 (OE when not bypassing flip flop 130) shows that transitions in signal 250 occur sooner than that of signal 230.

Consider next the operation of circuit 100 in a power saving mode of a high impedance (high-Z) state on PAD (node 190) as shown at signal 245. When signal 250 (OE) goes high, the output transitions to the same level as shown by segment 295 appearing on the PAD signal. The difference occurs between the time marked 295 corresponding to "save power high-Z" and the time marked 297 corresponding to $V_{OHT}$ or voltage output high time. During time segment 295, the voltage level remains constant and the circuit is transitioning from a high-Z state (that is being pulled up by the terminating resistor) to a driven state (where I/O section 95 turns on) and is driven high. Both states are at the same voltage level but different agents are controlling the bus. The first agent is relinquishing the bus and transitioning to a high-Z state. The second agent is going to drive the bus to the same level as the previously level. Since the high-Z level and the voltage output high level are at the same level, the circuit "pre-drives" or anticipate the signal and drives it to the high-Z voltage level and then turns on the driver, thus bypassing the time delay through the output enable circuitry.

When signal 235 switches, signal 255 (PAD) also switches. Performance improvement of one example is evident by a comparison of signal 240 and signal 255. In one example, the time improvement is 390 picoseconds and corresponds to the clock-to-Q propagation delay of a flip flop in a particular technology. Clock-to-Q is the latency, delay or propagation time between a rising edge of the clock to the output transition. The clock-to-Q value is technology specific.

According to one example, an improvement of 390 picoseconds corresponds to an effective increase in the clock frequency. With increasing clock frequency, the percentage improvement increases.

FIG. 3 illustrates a multi-load bidirectional bus circuit 300 with terminating supply voltage $V_{TT}$ and terminating resistor $R_T$ connected to foil 310. Foil 310 is connected to I/O chip 315, I/O chip 325 and I/O chip 335, however more or less devices or agents are also contemplated. Foil delay, called TT, represents the output of I/O chip 315 to I/O chip 325 and is the time for adjacent chips to fire. The foil delay is the minimum distance between chips. Circuit 100 provides that foil delay TT will be greater than time $V_{ohT}$ (shown at 297 in FIG. 2).

Time $V_{ohT}$ runs from the transition from a high-Z state to a high voltage state. If foil delay TT is too small, then it encroaches on time $V_{ohT}$. This condition arises when one driving agent (for example, I/O chip 325) is driving the bus and has not completed its transition and another driving agent, (for example, I/O chip 315) attempts to take over the bus. This causes contention and may cause an error. Contention can be avoided provided foil delay TT is greater than time $V_{ohT}$.

$V_{ohT}$ will increase in time as the clock period is reduced. If the clock period is too slow, then time $V_{ohT}$ will increase larger than the foil delay TT and will result in contention.

In one example, operation of circuit 100 is programmable. Determining factors include the bus speed and the clock frequency and the minimum trace delay. The minimum trace delay is greater than the time $V_{ohT}$ or else the circuit is turned off.

In high-Z state, the terminating resistor, such as $R_T$ pulls the voltage up to $V_{TT}$. If the bus is at $V_{TT}$, it can be floating (with no driving agents) or a particular driving agent can be providing a logical one level. If the OE is turned on, then circuit 100 anticipates operation at a high-Z level and assumes that the agent will take over the bus at the next clock cycle. In other words, circuit 100 anticipates that the bus has been released by the previous agent when the core logic indicates to drive low.

Circuit 100 recovers the propagation delay from the OE of the I/O. At time 296, signal 255 transitions from a high-Z state to a voltage high state. In both conditions, the voltage level remains unchanged but there is a drive change and a drive change means there is active current. In the high-Z state, the resistor to the terminator maintains the voltage with no current (passive). On the other hand, when the OE turns on, a current flows into the path and maintains the voltage level (active).

In the example illustrated, the rising edge of signal 230 (OE) occurs after signal 235 (A) drops. In contrast, circuit 100 provides that the rising edge of signal 250 (OE) is before signal 235 (A) drops.

The right side of FIG. 2 illustrates circuit performance with a falling edge. The second edge on signal 215 (data) is a falling edge. Signal 220 (Q0) falls after the rising edge of signal 205 (clock 1). After the rising edge of signal 210 (clock 2), signal 225 (Q1) will fall. When signal 225 (Q1) drops, and since gate 150 is an OR gate with the other inputs low already, node 170 (signal 230) also falls.

Signal 235 (A) has already risen and then signal 230 (OE) falls so signal 240 (PAD) transitions from a $V_{OH2}$, (driven) to a voltage high or a logic one level and a quarter of a clock period later, the signal changes to a high-Z state. The voltage level remains unchanged (from $V_{OH2}$ to high-Z) but the drive is different.

The bus was released a quarter cycle later. On a positive edge of signal 205 (clock 1) the circuit is activated. Circuit 100 releases the bus early and provides power savings.

Circuit 100 anticipates when to turn the driver on and anticipates opportunities to shut it off and save power with no changes to timing.

In the example illustrated in FIG. 2, the time between the rising edge of clock to the falling edge of clock is 1.25 nanoseconds, however other times are also contemplated.

In one example, circuit 100 is operated using multiple frequencies.

In various examples, logic 90 is configured to operate with different I/O drivers. In one example, I/O section 95 includes a Gunning transistor logic (GTL) driver.

In one example, circuit 100 is bypassed if the clock speed is slow. FIG. 3 illustrates exemplary circuit 300. Foil delay TT represents the smallest delay time between adjacent drivers. In one example, if the foil delay TT is greater than time $V_{ohT}$, then circuit 100 is turned on. In one example, a dual-layer board is used with chip 315 on one side and chip 325 on another side.

Other alternatives are also contemplated. For instance, in one example, a programmable delay line is used to adjust the time delay. With sufficiently fast core logic, a delay line can be used to compensate for excessive speed caused by, for example, adjacent devices. A delay line on the input of AND gate 120 can be controlled by an impedance controller. An impedance controller measures conductance or the speed of the silicon and provides a correction to avoid contention on the bus.

In one example, an auto-adjustable impedance controller or look-up table is used to determine the speed based on factors such as the path length and the silicon speed. The bypass of circuit 100 can be automatically selected or deselected.

In one example, a decoder is provided in line with node 105. An impedance controller is used to determine a speed or whether or not to bypass depending on the speed of the silicon. As such, circuit 100 can be configured for automatic adjustment. In one example, a decoder provides an output on node 105 to turn on or off the bypass.

In one example, an impedance controller provides impedance bits which are set to a logical high or low. For example, the upper bits of the impedance can be configured to determine whether the silicon is fast and the lower bits can be configured to determine whether the silicon is slow. As such, the impedance controller provides a binary function which automatically selects bypass when needed.

In a circuit for use with a laptop, cellular telephone or other battery limited device, OR gate 150 provides power savings. When transitioning to a $V_{OH}$ level, a quarter cycle later the bus goes to the high-Z state, thus saving power.

However, in a high speed super computer or other application with sufficient power, OR gate 150 can be omitted. As such, node 125 is connected directly to node 170. In one example, AND gate 120 is omitted.

In one example, a regular or JK flip flop is used rather than a delay (D) flip flop. In one example, the flip flops are replaced with a master-slave latch wherein flip flop 130 serves as the master and flip flop 135 serves as a slave.

In addition to the logic of circuit 100, the driver can be configured for improved performance as described herein.

In the example illustrated in FIG. 4A, output section 400 includes a voltage divider having legs of p-channel field effect transistors (PFETs) and n-channel field effect transistors (NFETs). No implanted or passive resistors are included in the circuit, thus reducing delay caused by capacitive loading effects.

In circuit 400, the sizes of the transistors are selected to achieve a desired ratio of resistances presented by the legs. For example, NFET 420 and NFET 425 are each of the same size and have an arbitrary size value of one. In addition, NFET 435 and NFET 440 are of the same size and each has a value of five times larger than NFETs 420 and 425. Accordingly, the ratio of resistances for the NFET side is 5:1.

In FIG. 4B, circuit 460 illustrates an equivalent circuit having switched resistances. For example, PFETs 405 and 410 of circuit 400 are modeled in circuit 460 as resistor 465 and switch 470, respectively. In one example, pull-up resistor 465 has a nominal value of 35 ohms. In addition, NFETs 420 and 425 of circuit 400 are modeled in circuit 460 as switch 480 and resistor 485, respectively and NFETs 435 and 440 of circuit 400 are modeled in circuit 460 as switch 495 and resistor 498, respectively. In one example, resistor 498 has a nominal value of 8.4 ohms and resistor 485 has a nominal value of 42 ohms. The parallel combination of resistors 498 and 485, when switches 495 and 480 are closed, has a nominal pull-down value of 7 ohms.

By using active devices rather than passive resistors, the capacitance is reduced, meaning that the circuit runs faster and the device sizes are reduced by half the layout area.

Figure 5A:
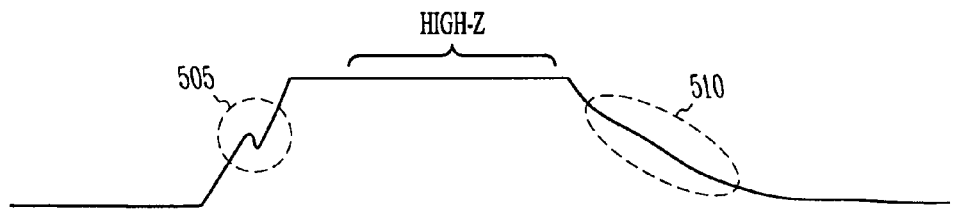
FIGS. 5A, 5B and 5C illustrate output signals as a function of time.
Figure 5B:
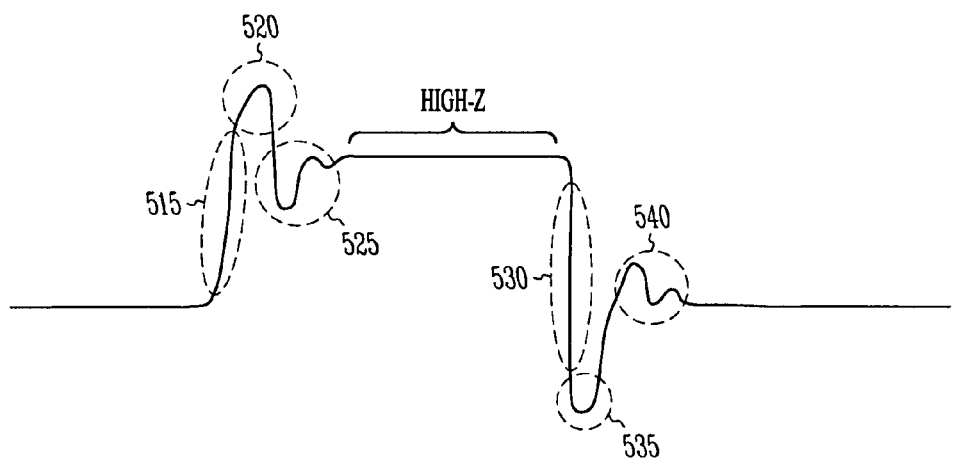
Figure 5C:
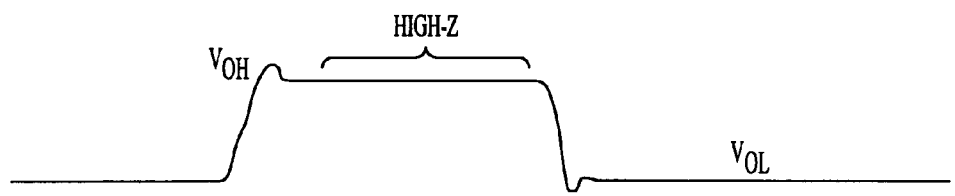

FIGS. 5A, 5B and 5C illustrate output signals as a function of time. For example, FIG. 5A depicts an uncompensated circuit with a slow corner. A small step appearing at detail 505 occurs on the rising edge. In the present subject matter, the nominal rate is 2.2 volts per nanosecond in all corners whether for the best case, the nominal case or the worst case corner. In addition, the present subject matter provides that the time at the high voltage level also gets reduced.

As used herein, the aspect ratio describes the edge time versus high time. High time refers to how long the signal is held at the $V_{OH}$ level.

FIG. 4A can also be used to describe sizing of the base structure transistors for the output section. As such, node 406 receives $P_{sig}$ and node 411 receives $PVT_{P1}$ and transistors 405 and 410 each have a base size of $5x_P$. In a similar manner, node 436 receives $PVT_{N1}$ and node 441 receives $N_{sig}$ and transistors 435 and 440 each have a base size of $25x_N$ and transistors 420 and 425 each have a base size of $5x_N$. Node 426 is coupled to enable EN. Nodes 430 are tied to ground and node 402 is tied to $V_{DD}$. A ratio of 5:1 is established between the NFETs and PFETs. The circuit of FIG. 4A is repeated seven times in one example.

FIG. 4A can also be used to describe the sizing of the step or slice elements that provides control for variation in process, voltage and temperature. As such, node 406 receives $P_{sig}$ and node 411 receives $PVT_{P*}$ and transistors 405 and 410 each have a base size of $1x_P$. In a similar manner, node 436 receives $PVT_{N*}$ and node 441 receives $N_{sig}$ and transistors 435 and 440 each have a base size of $5x_N$ and transistors 420 and 425 each have a base size of $1x_N$. In this notation, the symbol * corresponds to numbers 2, 3, 4, 5, 6, 7 and 8. Node 426 is coupled to enable EN. Nodes 430 are tied to ground and node 402 is tied to $V_{DD}$. Again, a ratio of 5:1 is established between the NFETs and PFETs. The circuit of FIG. 4A is repeated seven times in one example.

For the base section, the transistors are larger and the sizes are 25:5 (which reduces to 5:1) and in the slice sections, the transistors are 5 times smaller and with sizes at a 5:1 ratio.

Each output section can be modeled as a Thevinized output as shown in FIG. 4B. Rather than requiring 3 power supplies (a high power supply, a low power supply and a terminating power supply) as in the typical driver, the driver of the present subject matter provides a mechanism for generating the terminating power supply between the two power supplies.

Figure 6:
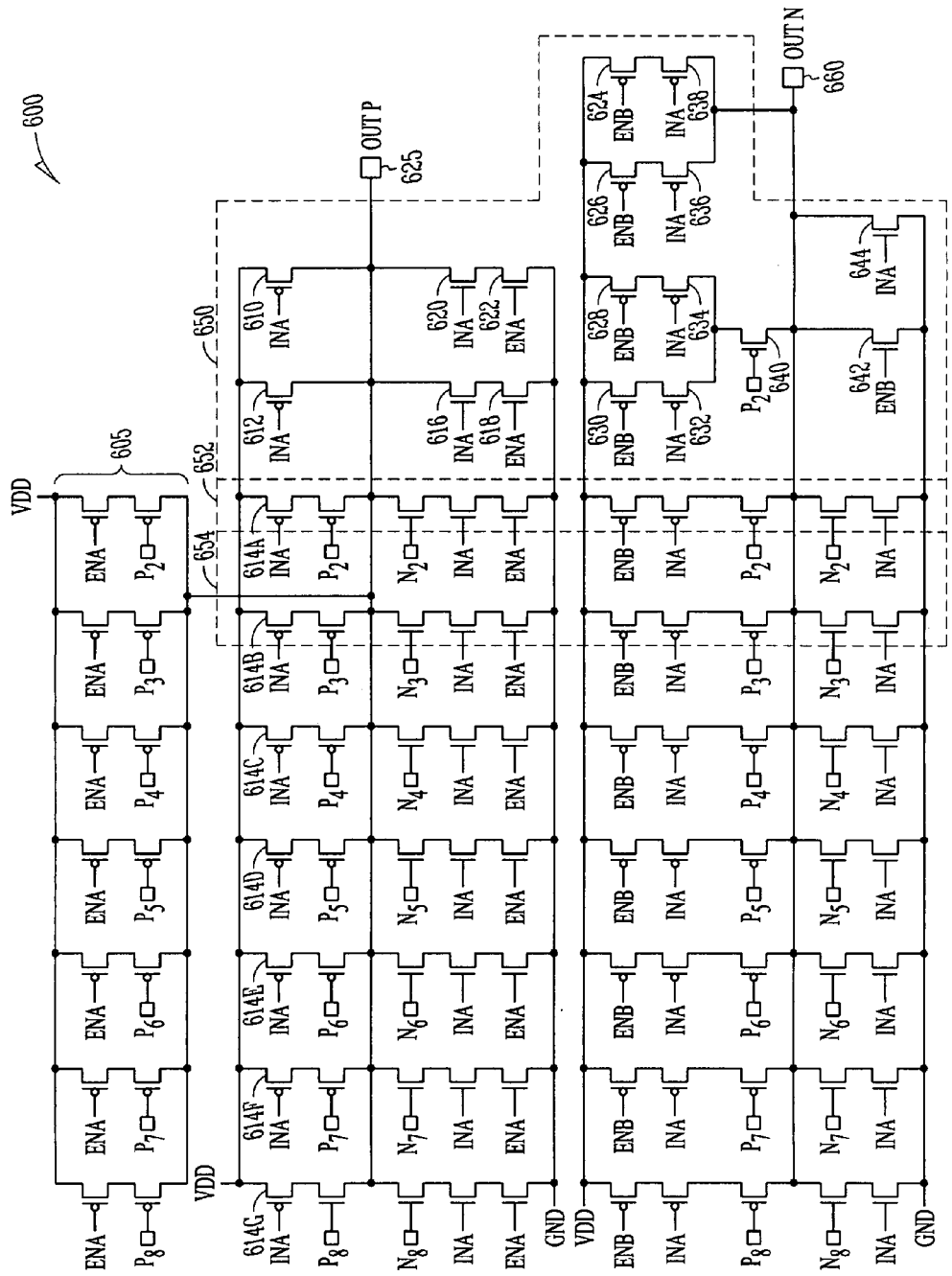
FIG. 6 illustrates a programmable pre-driver.

To stabilize circuit 400, a pre-driver is provided, as illustrated in FIG. 6.

Circuit 605 in FIG. 6 illustrates a pre-driver according to one example of the present subject matter. Circuit 605 compensates for turning on and off when the bus is to be turned around. In such a case, the transistors are to be switched off and the transitions are to be synchronized in a particular manner to avoid an overshoot, an undershoot or ringing and also to absorb reflections of the signal.

Circuit 605 includes a FET array for PFET tristate control. The transistors of circuit 605 controls the rising edge on and the falling edge turning off as well as the 35 ohm termination turning on and off. The PFETs of circuit 605 turns the 35 ohm PFETs on and off more stably.

In the fast corner, circuit 605 serves to slow down the PFET. The present circuit turns the PFETs off more slowly and holds the termination on for a longer period of time. The 35 ohm PFET pull-up device acts as both a rising edge pull up device and as a termination device.

At bus changeover, the edge is raised to $V_{OH}$ level and then the driver is turned off completely. When the driver is turned off completely, unstable edges (including overshoot, ring back and reflections) are expected. The present subject matter slows down the PFET turning on and off in the fast corner and, on the slow corner, it speeds it up and in the nominal corner, the speed is set to a middle value. The present subject matter addresses signal problems illustrated at areas 505, 510, 515, 520, 530, 535 and 540 in FIGS. 5A and 5B. Areas 505 and 510 illustrate slow corner edge problems in and out of high-Z state. For example, area 505 illustrates a step in the rising edge caused by contention between the large NFET in the output sections turning off and the small PFETs turning on for the rising edge then off for the high-Z. At area 510, contention appears between the large NFET turning on and the PFETs turning off because of a slow falling edge. Areas 515, 520, 525, 530, 535 and 540 illustrate fast corner edge problems in and out of high-Z state. At area 515, the rising edge is too fast because NFET output section turns off too fast while PFET section turns on too fast. At area 520, the signal illustrates a large overshoot with a peak voltage well in excess of the logical high voltage level. At area 525, the signal rings back a reflection because the PFET termination turns off too quickly which may trip the input receiver to the wrong state. At area 530, the falling edge from high-Z state to $V_{OL}$ is too fast because the strong NFET turns on and the PFETS turn off too quickly. Area 535 illustrates the resultant overshoot in the $V_{OL}$ level. Area 540 illustrates a reflection ring back in the $V_{OL}$ level that may be high enough to trip the input receiver into the wrong state. In the fast case corner illustrated in FIG. 5B, the edge rate is slowed down slightly and the termination device is turned off more slowly. The termination device is allowed to let the signal ring back down the line and come back and be absorbed in the terminator before it is finally turned off. In particular, the edge is controlled in that the driver is turned on rather quickly. The transition from the $V_{OL}$ to the $V_{OH}$ is turned on quickly and at the end of the edge rate, the PFET is turned on, thus weakening the PFET using circuit 605.

As noted earlier, the 35 ohm PFET acts as a pull up agent that causes the rising edge and after raising the edge to the high level, the PFET also acts as a termination device.

If the termination device is turned off too quickly, then the signal activity put on the line (for example, a foil of the printed circuit board) will travel to the end and bounce back and cause a reflection. If the 35 ohm PFET has been turned off too quickly, the reflection will cover the full rail, thus causing a bump to appear on the rising edge. On the other hand, if the PFET 35 ohm terminator remains on for a sufficiently long period, then it will absorb the reflection on the line. After the reflected signal is absorbed, then the PFET can be turned off.

Through simulation, and based on the length of the bus, the time required for the reflection to return can be determined and the sizes of the PFETs are configured to absorb the signal at the proper time. For example, the length of the line (foil line) is known) and the locations of the reflections can be established using simulations. The simulations also are used to configure the size of the PFETs in circuit 605 to achieve absorption at the proper time.

The 35 ohm output resistance remains a constant. The value of 35 ohms is selected based on the impedance of the printed circuit board and the external terminator are about 55 ohms.

In the present example, the terminators on the printed circuit board are 55 ohms so the drivers are set to a slightly lower resistance then the characteristic impedance of the transmission line which, in this case, is 35 ohms. Circuit 605 controls the switch in terms of how fast the switch turns on and off. The 35 ohm is a PFET which acts like a variable resistor. The manner in which the circuit is turned on and off determines the edge rates. Here, the edge rates are controlled with circuit 605.

In the fast case corner, the output is running too fast and in the slow case corner the output is running too slow. Circuit 605 adjusts the speed to approach the nominal corner.

Circuit 605 includes an impedance controller which provides an adjustment based on the process, the temperature and the voltage. The impedance controller uses a reference.

The impedance controller effectively sizes the output driver and thus, control the edge rates. In the driver, the 35 ohm PFET is turning on and off and in the lower portion, an 8.4 ohm NFET is turning on and off. In addition, an NFET of 42 ohms is also turning on and off.

In the present circuit, the edges are controlled by the pre-driver. Other circuits can also be utilized to control the edge rates and reduce instability. In the circuit of FIG. 6, circuit 600 includes numerous independently controlled functions shown. For example, circuit 600 provides control of the rising and falling edges to separate PFETS and control of the rising and falling edges to separate NFETs.

Other circuits for stabilizing the output are also contemplated. For instance, in one example a circuit provides control for rising and falling edges of the NFETS without controlling the PFETs. In another example, the speed is reduced thereby reducing the complexity of the pre-driver.

In FIG. 6, circuit 605 is configured to control switching of the PFETs. By controlling the PFETs, the circuit also controls the edges since it controls how fast they pull up and how fast they release. In addition, circuit 605 also controls the duration of holding the termination at a particular level, thus matching the timing of the turning on and off of the NFETs.

The individual transistors of circuit 605 are sized and balanced to match the particular output characteristics and target edge rate. In the example illustrated, the transistors are sized to match the nominal 55 ohm output impedance at the target edge rate.

In exemplary circuit 600, base structure 650 is encircled by a dotted line in the figure and includes transistors 612, 610, 620, 616, 618, 622, 630, 628, 626, 624, 632, 634, 636, 638, 642, 644 and 640. Each transistor in base structure 650 normally remains turned on whether the circuit is operating in the best case, nominal case or worst case relative to the particular process, voltage or temperature. In addition, exemplary circuit 600 includes a plurality of selectable control legs or slices, with each slice including transistors illustrated in a vertical column. Representative slices 652 and 654 include transistors that can be selectively turned on or off to compensate for variations in process voltage and temperature. The corresponding transistors in each slice (for example, leg 652 and leg 654) are of the same size. The transistors of base structure 650 are all relatively large as compared with the transistors of each slice.

In the example illustrated, the width of PFET transistors 610, 612 and 614A is 6.3, 0.54 and 0.8 microns, respectively. Transistors 614A through 614G are of the same size and are selectively turned on or off to adjust for variations in process, voltage and temperature.

The transistors of base structure 650 control the rising and falling edge supplied to the PFETs at outputP 625. OutputP 625 is coupled to the gate of the PFET output section which determines how fast the output is turned on and off.

The transistors in box 652 and box 654 represent individual control slices. As the process, voltage or temperature get slower, additional slices, as represented by boxes 652 and 654, are turned on. With continued drop in the process, voltage or temperature, the next slice is turned on. In the very worst case, the slow process corner, low voltage and high temperature, all slices would be turned on. In the example illustrated, each slice is individually selectable by means of terminals N2, N3, N4, N5, N6, N7 and N8 and terminals P2, P3, P4, P5, P6, P7 and P8.

This circuit provides independent control of the PFETs and the NFETs. If the processing were to yield, for example, fast PFETs along with slow NFETs, then the PFETs and NFETs are independently selectable or controllable. In addition, if the PFETs were slow and the NFETs were fast, this circuit would compensate and control the edge rates and the output impedance even if the process corners were skewed.

In the example illustrated, circuit 605 is coupled to base structure 650 at outputP 625. Circuit 605 is directed to controlling PFETs. In one example, a comparable circuit is used to control NFETs.

The NFETs have an effective "on" resistance of 7 ohms and the PFETs have an effective "on" resistance of 35. Accordingly, the lower resistance of the NFETs means that the NFETs will dominate the output.

However, at higher bus speeds, circuit performance becomes sensitive to the manner of switching of the PFETs. In circuit 605, the transistor gates are tied to ENA (enable). The ENA connection on the PFETs is comparable to the ENB connection on the NFETs as shown at representative transistor 630. Transistor 630 serves to pull down the output rather than pull up the output as in circuit 605.

The NFETs, of which transistor 630 is representative, are configured to control outputN 660 which is coupled to the gate of the output section. OutputN 660 stabilizes the edge of the NFETs.

Control for variations in process, voltage and temperature is provided to circuit 605 at nodes P2, P3, P4, P5, P6, P7 and P8, also referred to as PVT bits. The PVT bits are configured for turning on or off the individual transistors. An impedance controller circuit is used to monitor the process, voltage and temperature and selectively provide a switching signal to the corresponding PVT bits. The ENA nodes in circuit 605 are the signaling bit which determines if the circuit is to go to a logical 0, a logical 1 or turn off (tristate).

The transistors in the array of circuit 605 are all the same size. In the example illustrated, circuit 605 does not include a base structure.

In one example, the present subject matter operates under the assumption that every bus transaction could be the last transaction prior to releasing the bus for pick-up by another agent. For example, when the driver puts a logical "1" on the bus, it automatically turns the OE signal off after it reaches a "1" level anticipating that this agent could release the bus.

If the bus is picked up by another agent, the circuit first turns on the OE signal and then drives the signal to the next proper state. Another agent can pick up the bus since the present driver has already released the bus knowing that it would either pick it back up again or release it to another agent. In sum, no time is lost in waiting for the bus to be released using the OE pin. In one example, the present circuit will release the bus every time the bus is driven to a "1" logic level and will pick-up the bus earlier every time the bus is driven to a "0" logic level.

If the bus is running too slowly, the data on the bus can be unstable since the resistance and capacitance of the bus that is holding the state could be driven or leaked off. For slow bus speeds, a programmable signal turns off (or bypasses) the anticipatory pre-driver circuitry. At a slow rate, the driver can hold the state for the entire time.

In one example, an array of programmable FETs are used in the pre-driver to re-size the pull-up, pull-down and hold function of the devices used for driving the bus. The output stage omits passive resistors and includes transistors only. This allows for smaller component sizes reduced current.

It is to be understood that the above description is intended to be illustrative, and not restrictive. For example, the above-described embodiments (and/or aspects thereof) may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

What is claimed is:

1. A method comprising:
   receiving a data input signal;
   generating an output enable signal for a driver, the output enable signal based on the data input signal;
   driving a bus to a particular logic level using the driver, the logic level based on a driver input and based on the output enable signal, wherein the driver input is provided to the driver, and the driver input is based on the data input signal; and
   setting the bus to a high impedance state by toggling the output enable signal; and wherein a time delay between receiving the data input signal and generating the output enable signal is less than a time delay between receiving the data input signal and providing the driver input.

2. The method of claim 1 wherein generating the output enable signal includes executing a logical or function with the data input signal.

3. The method of claim 1 wherein generating the output enable signal includes receiving a bypass signal, and wherein the bypass signal is logically ANDed with the data input signal.

4. The method of claim 1 further including setting the bus to the high impedance state prior to driving the bus to the particular logic level.

5. A system comprising:
   an output section having an output enable node, a level node and a pad node;
   a inverter having an output coupled to the level node;
   a logical OR gate having an OR output node coupled to the output enable node;
   a first flip flop having a Q1 output coupled to a first input of the logical OR gate;
   a logical AND gate having an AND output node coupled to a second input of the logical OR gate;
   a second flip flop having a Q0 output coupled to an input of the first flip flop, an input of the inverter and a third input of the logical OR gate;
   a data input node coupled to an input of the second flip flop and a first input of the logical AND gate;
   a bypass node coupled to a second input of the logical AND gate;
   a first clock coupled to a second input of the second flip flop; and
   a second clock coupled to a second input of the first flip flop.

6. The system of claim 5 further including a delay line coupled between the data input node and the first input of the logical AND gate.

7. The system of claim 6 wherein the delay line is adjustable.

8. The system of claim 5 further including an impedance controller coupled to the output section.

9. The system of claim 5 wherein at least one of the first flip flop and the second flip flop include a JK flip flop.

10. The method of claim 1 wherein generating the output enable signal includes executing combinatorial logic having inputs including a clock and the data input signal.

11. The method of claim 1 wherein generating the output enable signal is independent of the particular logic level generated by the driver.

12. The method of claim 3 wherein receiving the bypass signal includes configuring the bypass signal based on a clock speed.

* * * * *